March 15, 1966 C. L. DE MILLE ETAL 3,241,011

SILICON BONDING TECHNOLOGY

Filed Dec. 26, 1962

Cecil L. DeMille,
Frank J. Saia,
John G. Quetsch, Jr.
*INVENTORS.*
*BY.*
Charles S. Haughey
*ATTORNEY.*

3,241,011
SILICON BONDING TECHNOLOGY

Cecil L. De Mille, Santa Ana, John G. Quetsch, Jr., Anaheim, and Frank J. Saia, Costa Mesa, Calif., assignors to Hughes Aircraft Company, Culver City, Calif., a corporation of Delaware
Filed Dec. 26, 1962, Ser. No. 246,948
8 Claims. (Cl. 317—234)

This invention relates to silicon bonding technology, and particularly to ohmic connections to silicon semiconductor devices.

In fabrication of silicon semiconductor devices, such as diodes, rectifiers or transistors, it is important to obtain a low electrical resistance, shock resistant bond between a physical support member and the silicon crystal. Where a crystal element is first produced as an active element, such as a silicon diode having a PN junction near the top surface of a largely N-type crystal, and especially where one or more electrode elements are already attached to the device, the attachment of the crystal to a package support element must not disturb the first connection, yet it must be strong and reliable as well as electrically adequate. Various solders used for such support connections, such as gold or tin, are prone to relatively high resistance bonds and to poor physical bonding, or poor or insufficient wetting, to such a degree as to allow removal of the crystal after bonding, by physical force only, without breaking the crystal. Such relatively weak bonds are subject to failure from shock and other causes. Where aluminum and gold are used to make an emitter or anode electrode connection, a simultaneous or subsequent back contact and crystal mounting operation must not exceed about 400° C. or a purple gold-aluminum phase is formed which is too brittle for reliable operation, and is subject to breaking of the connection.

This invention is directed to the formation of a physically strong and electrically reliable mounting and support contact between a silicon crystal and a package support element such as an electrode, particularly well suited for use in diffused junction, fast computer diodes where thin semiconductor dice are used. Such a bond is formed by alloying copper and tin to the silicon, at a temperature sufficiently high to form a three-element silicon, tin and copper phase, yet low enough to avoid excessive solution of the silicon. An electrode connection is also provided which is not subject to formation of a brittle gold-aluminum phase.

For further consideration of what is believed to be novel and our invention, attention is directed to the following portion of the specification, the appended claims and the drawing, in which:

Figure 1:
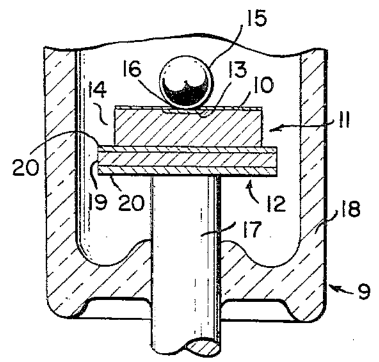
FIG. 1 shows an assembly of a silicon crystal device, a bonding alloy and a package support element before bonding.

The preferred form of the invention will be disclosed in the production of a fast, diffused-junction silicon computer diode and the packaging thereof. As shown in FIG. 1, a preformed silicon diode element 11, a bonding alloy preform 12 and a conventional glass package "first seal" 9 are assembled for bonding. The diode element comprises an N-type silicon crystal die with an oxide insulating film 10 on a top surface thereof and forming an aperture in the film 10. A P-type dopant material such as boron, aluminum, gallium or indium has been diffused into the crystal through the film aperture, to form a thin P-type region 13 adjacent the N-type main body region 14 of the die, and thus forming between the regions a P–N junction.

An electrode 15 has been bonded to region 13 of the crystal through the aperture, and is thus ohmically connected to the P-type region 13. The electrode 15 may be a silver ball bonded to the crystal by a very thin film of gold so as to form a gold-silver-silicon bonding alloy 16 of sufficient silver content to preclude the gold dissolving into the crystal and shorting the P–N junction therein. This is a "self-quenching" alloy because higher temperatures dissolve more silver and prevent excessive solution of silicon. Alternatively, a relatively inert ball of molybdenum, tantalum or other refractory metal may be used with a silver-gold bonding alloy. Refractory is used here in the sense of retaining its physical shape at the higher temperatures encountered. This emitter contact per se, by a refractory ball electrode, is disclosed and claimed in our copending U.S. patent application Serial Number 200,813.

The preform 12 may be a copper plate 19 clad with tin 20, or a relatively inert, refractory metal such as tantalum or molybdenum clad with a copper-tin alloy. The preform 12 may contain in the coating or on its surface a small quantity of a metal suitable for doping the crystal, such as antimony for an N-type dopant. Antimony may also be used for its wetting properties, as well as its doping characteristics, and has been added to tin cladding on copper in varying concentrations, about 0.1 to 1.0% being preferred. Only about 0.1% antimony will dissolve in the tin or tin copper, in commercial practice, and any excess serves primarily to enhance wetting properties of the alloy. Larger quantities, above about 5%, cause the low vapor pressure antimony to escape from the melt at temperature and provide atmosphere impurities.

The diode element 11 and the preform 12 are mounted on the central post or wire 17 of the first seal 9 preparatory to bonding. The first seal may comprise the wire 17, preferably of wire whose thermal expansion characteristics match those of a portion of the glass envelope 18 bonded thereto. Typical wires for such uses comprise a thin copper surface coating over a nickel-iron-cobalt core for improved bonding to the glass, and the copper facilitates the bond of the preform 12 to the wire.

Figure 2:
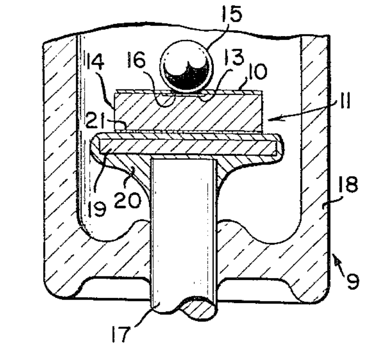
FIG. 2 shows the assembly of FIG. 1 after bonding.

The assembly of FIG. 1 is heated to a temperature in excess of 415° C. above which a copper-tin-silicon phase 21 may form, but not over about 500° C., above which temperature the solution of the silicon becomes excessive and rapid. A temperature range of 460° to 480° C. is preferred. For heavier silicon bodies, temperatures up to about 550° C. may be used, producing large volumes of phase 21. For this bonding, a refractory preform 12 of molybdenum or tantalum coated with copper-tin between 0.7% to about 26% copper (the copper content depending on the alloying temperature), preferably about 10% copper, with or without a small quantity of antimony, may be used. Less copper and the alloy will not properly wet or dissolve silicon, and more than about 26% copper may dissolve excessive quantities of silicon and require too high a bonding temperature. Although neither copper nor tin will by itself wet and properly bond to silicon at these temperatures, tin with over 0.7% copper will wet and alloy to silicon. The percent of copper in phase 21 is expressed as a percent of the copper and tin therein. The percent of silicon in the phase varies between presently unknown limits; it is believed to be of the order of 10%, but not over about 25%.

Where desired, the preform 12 may comprise a copper plate 19 clad with tin 20, and during the heating step sufficient copper will dissolve into the tin to make it wet and alloy to the silicon at temperatures above about 415° C. For example, a .005" thick copper plate coated on both sides with .0025" tin containing, for improved wettability and for doping purposes, 0.1 to 1.0% antimony, may be used at 460° to 480° C. for three minutes to form a thin alloy bonding phase 21 of copper, silicon and tin as shown in FIG. 2. The balance of the tin, with small dissolved quantities of copper, forms an alloy bond to the copper-clad wire 17. When a dopant such as antimony is not used with the preform 12, it may be desirable to diffuse an N-type dopant such as antimony, arsenic or phosphorus into the back of the crystal before mounting and bonding.

Figure 3:
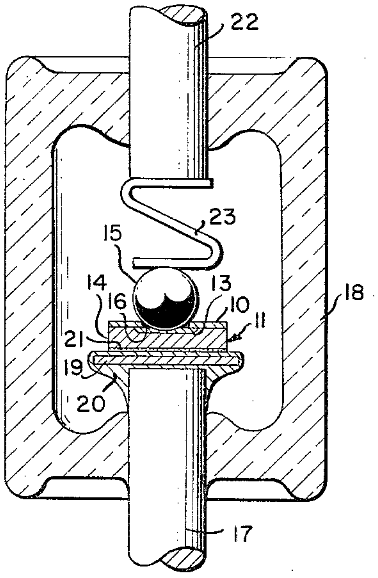
FIG. 3 shows a complete diode in a glass package incorporating the assembly from FIG. 2.

The assembly of FIG. 2 may be next finished as shown in FIG. 3 by adding a "second seal" element comprising an electrode wire 22, a glass bead and a whisker wire 23, which upon heating to finally seal the package, completes the glass envelope 18 and makes electrical contact between the whisker wire 23 and the electrode 15. The wire 23 may be of nickel with a gold-tin coating for forming a bonded connection to the electrode 15. It is shown as an S-shaped whisker, but C whiskers, loops or other shapes may be used.

Figure 4:
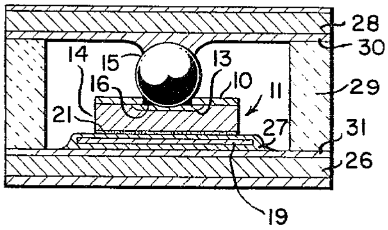
FIG. 4 shows an alternate package of the leadless, microminiature type incorporating the bond structure illustrated in FIG. 2.

This invention may alternatively be applied to the production of leadless microminiature diode elements as shown in FIG. 4 wherein the crystal diode assembly 11 is bonded to a bottom package gold clad electrode 26 by a copper-tin alloy 27 as above described, with or without the refractory core 19, to produce a copper-tin-silicon alloy phase between the silicon crystal and the copper-tin bonding alloy. As shown in FIG. 4, the crystal assembly 11 is bonded by an alloy 21 of copper-tin-silicon and a copper-tin alloy 27 to the bottom package electrode 26. The copper plate 19 of the preform serves here as a source of copper for diffusion into the tin, but it is not necessary for physical support of the crystal. In this package the alternate preform material of about 90% tin, 10% copper may be preferred. The final seal operation in producing the leadless microminiature diode shown in FIG. 4 gold bonds upper gold clad electrode plate 28 and the lower electrode plate 26 to a ceramic ring 29 whose ends have been metallized, the gold films 30, 31 forming hermetic seals to the ring 29 and the film 30 also electrically connecting and bonding the upper electrode plate 28 to the electrode ball 15.

This invention is particularly advantageous in the leadless, microminiature package of FIG. 4 because the bond of the electrode 15 to the crystal 11, the bond of the crystal 11 to the package electrode 26 and the final hermetic seal of the package may all be made simultaneously at a common temperature, or if preferred, either of the bonds may be made at an earlier time and at a higher or lower temperature than that of the final seal operation. In each of the bonds, the alloy systems are "self-quenching" in that an equilibrium percent of silicon, or silver, as the case may be, may be put into solution, and penetration of the alloy melt is stopped. Thus the percentages of elements in the bonding alloys are largely temperature determined. The package seal operation may thus be safely made, as preferred, at a temperature above, below, or equal to the first or second electrode bonding temperature, as well as making each of them at the same time and at the same temperature. This permits greater manufacturing flexibility in meeting desired device specifications while obtaining superior bonds.

What is claimed is:

1. A silicon semiconductor device comprising:
a silicon semiconductor body;
a mounting member for said body;
a copper-tin alloy containing at least 0.7% copper on said mounting member;

a copper-tin-silicon alloy between said body and said copper-tin alloy;
an electrical contact element;
and an alloy comprising silicon and gold bonding said contact element to said body.

2. A silicon semiconductor device comprising:
a silicon semiconductor body;
a mounting member for said body;
a copper-tin alloy on said mounting member containing at least 0.7% copper;
a copper-tin-silicon alloy between said body and said copper-tin alloy;
an electrical contact element having a silver surface; and
an alloy comprising silicon, gold and silver bonding said contact element to said body.

3. A silicon semiconductor device comprising:
a silicon semiconductor body having therein first and second regions of opposite conductivity type separated by a P–N junction;
a mounting member for said body;
a copper-tin alloy containing at least 0.7% copper on said mounting member;
a copper-tin-silicon alloy between said copper-tin alloy and one of said regions of said body;
an electrical contact element having a substantially spherical surface portion of silver;
and a silicon-gold-silver alloy bonding the second region of said body to said spherical surface region of the contact element.

4. A silicon semiconductor device comprising:
a silicon semiconductor body having therein first and second regions of opposite conductivity type separated by a P–N junction;
a mounting member for said body;
a copper-tin alloy on said mounting member;
a copper-tin-silicon alloy containing at least 0.7% copper alloy between said copper-tin alloy and one of said regions of said body;
an electrical contact element having a substantially spherical surface portion of silver;
and a silicon-gold-silver alloy bonding the second region of said body to said spherical surface region of the contact element.

5. A method of making a packaged silicon semiconductor device, which comprises:
bonding a substantially spherical contact element to a first surface of a silicon semiconductor body;
bonding a support member to a second surface of said body at a temperature above 415° C. with an alloy of tin and at least 0.7% copper to form between the main portion of said alloy and said body a region of copper, tin and silicon;
and hermetically encapsulating said body in a package making electrical contact to said support member and to said substantially spherical contact element.

6. A method of making a packaged silicon semiconductor device, which comprises:
bonding a substantially spherical contact element comprising a silver surface to a first surface of a silicon semiconductor body with a silicon-gold-silver alloy;
bonding a support member to a second surface of said body at a temperature above 415° C. with an alloy of tin and at least 0.7% copper to form between the main portion of said alloy and said body a region of copper, tin and silicon;
and hermetically encapsulating said body in a package making electrical contact to said support member and to said substantially spherical contact element.

7. A method of making a packaged silicon semiconductor device, which comprises:
bonding a substantially spherical contact element to a first surface of a silicon semiconductor body;
bonding a support member to a second surface of said body at a temperature above 415° C. with an alloy comprising at least 0.7% copper and tin to form between the main portion of said alloy and said body an alloy of copper, tin, and silicon;

and simultaneously hermetically encapsulating said body in a package making electrical contact to said support member and to said substantially spherical contact element at said temperature.

8. A silicon semiconductor device comprising:

an envelope having first and second substantially planar electrode members separated by an annular insulating ring element hermetically sealed thereto and forming in said package a chamber;

a silicon semiconductor body in said chamber and bonded to one of said electrode members by a copper-tin alloy containing at least 0.7% copper adjacent the member and a copper-tin-silicon alloy adjacent the body;

and said body being electrically connected to the other of said electrode elements by an alloy comprising gold, silver and silicon.

References Cited by the Examiner

UNITED STATES PATENTS

| | | | |
|---|---|---|---|
| 2,623,273 | 12/1952 | Murray et al. | 317—234 |
| 2,728,881 | 12/1955 | Jacobi | 317—235 |
| 2,736,847 | 2/1956 | Barnes | 317—234 |
| 2,763,822 | 9/1956 | Frola et al. | 317—234 |
| 2,842,831 | 7/1958 | Pfann | 317—235 |
| 2,863,105 | 12/1958 | Ross | 317—235 |
| 2,906,930 | 9/1959 | Raithel | 317—234 |
| 2,921,244 | 1/1960 | Emeis | 317—234 |
| 2,934,685 | 4/1960 | Jones | 317—235 |
| 2,957,112 | 10/1960 | Sils | 317—234 |
| 2,986,678 | 5/1961 | Andres et al. | 317—234 |
| 3,110,080 | 11/1963 | Boyer et al. | 317—235 X |

JAMES D. KALLAM, *Acting Primary Examiner.*

DAVID J. GALVIN, *Examiner.*

A. M. LESNIAK, C. E. PUGH, *Assistant Examiners.*